US008207797B2

(12) United States Patent
Wu et al.

(10) Patent No.: US 8,207,797 B2
(45) Date of Patent: Jun. 26, 2012

(54) BALUN

(75) Inventors: Han-Yang Wu, Taipei (TW); Keng-Chih Lin, Taipei (TW); Yi-Cheng Lin, Taipei (TW)

(73) Assignee: National Taiwan University, Taipei (TW)

( * ) Notice: Subject to any disclaimer, the term of this patent is extended or adjusted under 35 U.S.C. 154(b) by 296 days.

(21) Appl. No.: 12/696,969

(22) Filed: Jan. 29, 2010

(65) Prior Publication Data

US 2011/0001574 A1 Jan. 6, 2011

(30) Foreign Application Priority Data

Jul. 3, 2009 (TW) ................................ 98122516 A

(51) Int. Cl.
*H03H 7/42* (2006.01)
*H01P 3/08* (2006.01)

(52) U.S. Cl. .......................................... 333/26; 333/238

(58) Field of Classification Search .................... 333/25, 333/26, 238
See application file for complete search history.

(56) References Cited

U.S. PATENT DOCUMENTS 5,025,232 A * 6/1991 Pavio .............................. 333/26
7,471,167 B2 * 12/2008 Kim et al. ....................... 333/26

* cited by examiner

*Primary Examiner* — Dean O Takaoka

(57) ABSTRACT

A balun is provided. The balun includes a first substrate, a feed conductor, a second substrate, a first ground layer, a second ground layer and a common ground element. The feed conductor includes a feed portion and an extended feed portion. The feed conductor is disposed on the first substrate. The first ground layer is disposed on the second substrate corresponding to the feed portion. The second ground layer is disposed on the second substrate corresponding to the extended feed portion. A gap is formed between the first and second ground layers. The common ground element is disposed on the second substrate. The common ground element is electrically connected to the first and second ground layers. The common ground element includes a first common ground portion parallel and corresponding to the feed conductor.

18 Claims, 4 Drawing Sheets

BALUN

CROSS REFERENCE TO RELATED APPLICATIONS

This Application claims priority of Taiwan Patent Application No. 098122516, filed on Jul. 3, 2009, the entirety of which is incorporated by reference herein.

BACKGROUND OF THE INVENTION

1. Field of the Invention

The present invention relates to a balun (Balance to Unbalance transformer), and in particular relates to an easily manufactured balun.

2. Description of the Related Art

FIG. 1*a* shows a conventional balun 1, which has a cylindrical structure. FIG. 1*b* is a sectional view of the conventional balun 1. The balun 1 comprises a feed conductor 10, a first ground element 21, a second ground element 22 and a common ground element 30. The first ground element 21 and the second ground element 22 surround the feed conductor 10. The common ground element 30 surrounds the first ground element 21 and the second ground element 22. The first ground element 21 is connected to a first output port 23, and the second ground element 22 is connected to a second output port 24. The common ground element 30 is electrically connected to the first ground element 21 and the second ground element 22.

Conventionally, the feed conductor 10, the first ground element 21, the second ground element 22 and the common ground element 30 are manufactured by a machining process. Thus, it takes a relatively long time to manufacture the conventional balun 1, and costs are relatively high.

BRIEF SUMMARY OF THE INVENTION

A detailed description is given in the following embodiments with reference to the accompanying drawings.

A balun is provided. The balun comprises a first substrate, a feed conductor, a second substrate, a first ground layer, a second ground layer and a common ground element. The feed conductor comprises a feed portion and an extended feed portion. The feed conductor is disposed on the first substrate. The first ground layer is disposed on the second substrate corresponding to the feed portion. The second ground layer is disposed on the second substrate corresponding to the extended feed portion. A gap is formed between the first and second ground layers. The common ground element is disposed on the second substrate. The common ground element is electrically connected to the first and second ground layers. The common ground element comprises a first common ground portion parallel and corresponding to the feed conductor.

A width of the first ground layer and a width of the second ground layer on a first axis direction are greater than a line width of the first common ground portion. Therefore, a resistance between the feed conductor and the first ground layer is smaller than a resistance between the first ground layer and the common ground element.

In the embodiment, the feed conductor, the first ground layer, the second ground layer and the common ground layer are disposed on the first substrate and the second substrate to form a planar balun. The balun of the embodiment can be easily manufactured by multilayered PCB, LTCC, and semiconductor processes, which decrease costs and manufacturing time. Additionally, an operation bandwidth of the balun can be easily increased by tuning the line width of the first common ground portion.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
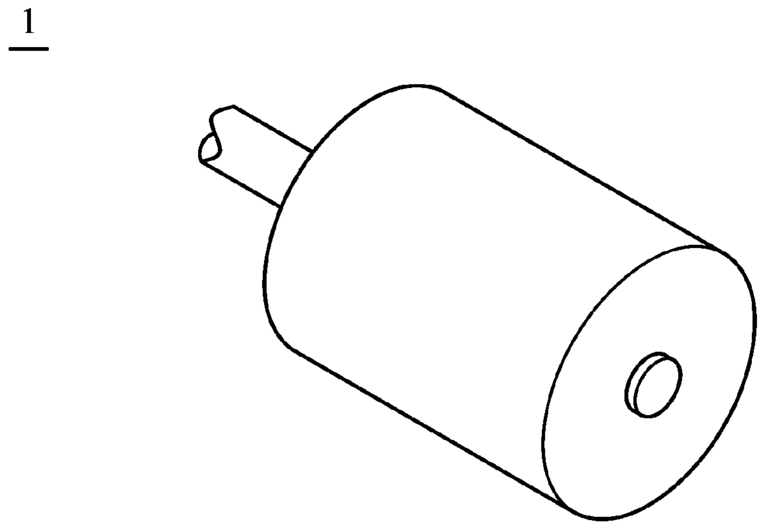
FIG. 1a ( PRIOR ART )
FIG. 1*a* shows a conventional balun.
Figure 1B:
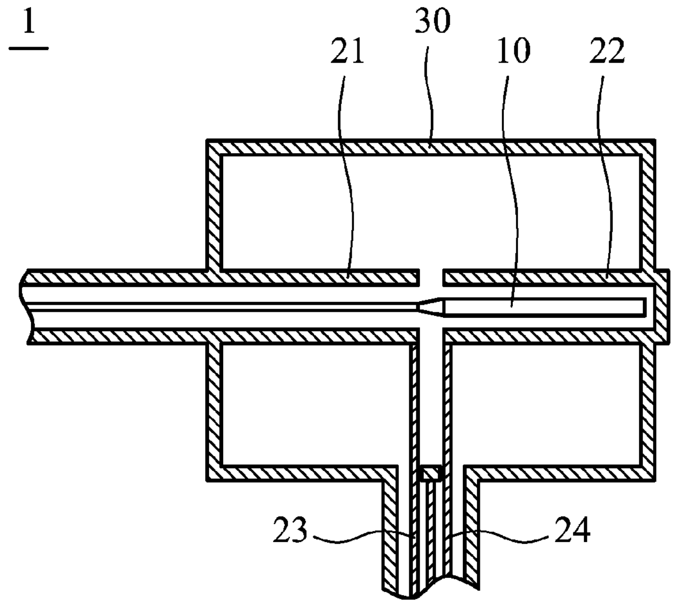
FIG. 1b ( PRIOR ART )
FIG. 1*b* is a sectional view of the conventional balun.
Figure 2:
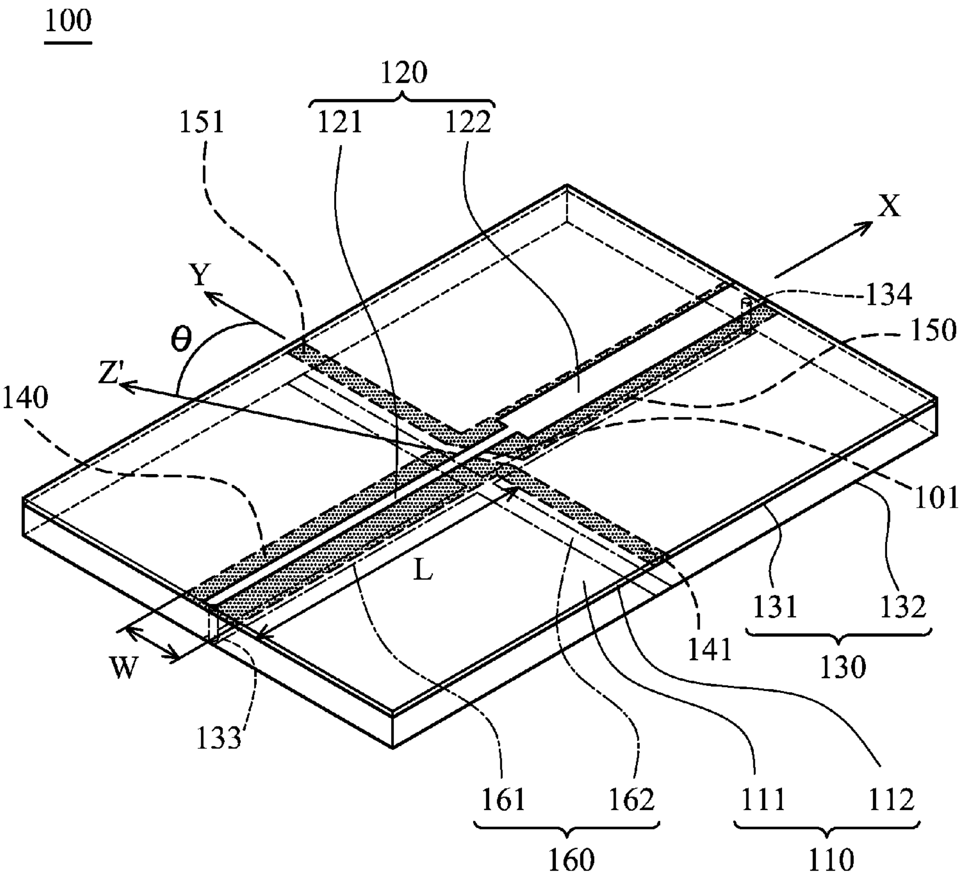
FIG. 2 shows a balun of a first embodiment of the invention.

FIG. 2 shows a balun 100 of a first embodiment of the invention for transforming an unbalanced signal to a balanced signal. The balun 100 comprises a first substrate 110, a feed conductor 120, a second substrate 130, a first ground layer 140, a second ground layer 150 and a common ground element 160. The first substrate 110 comprises a first surface 111 and a second surface 112. The first surface 111 is opposite to the second surface 112. The feed conductor 120 comprises a feed portion 121 and an extended feed portion 122, wherein the feed conductor 120 is disposed on the first surface 111 extending along a first axis X. The second substrate 130 comprises a third surface 131 and a fourth surface 132, wherein the third surface 131 is opposite to the fourth surface 132, and the third surface 131 faces the second surface 112. The first ground layer 140 is disposed on the third surface 131, and corresponding to the feed portion 121. The second ground layer 150 is disposed on the third surface 131, and corresponding to the extended feed portion 122. A gap 101 is formed between the first ground layer 140 and the second ground layer 150. The common ground element 160 is disposed on the fourth surface 132, wherein the common ground element 160 is electrically connected to the first ground layer 140 and the second ground layer 150, the common ground element 160 comprises a first common ground portion 161, and the first common ground portion 161 is parallel to the first axis X and corresponding to the feed conductor 120.

The first ground layer 140 comprises a first output port 141. The second ground layer 150 comprises a second output port 151. The first output port 141 and the second output port 151 are located on a second axis Y and extend toward opposite directions. The second axis Y is perpendicular to the first axis X. The common ground element 160 further comprises a second common ground portion 162, and the second common ground portion 162 is perpendicular to the first common ground portion 161. The second common ground portion 162 is parallel to the first output port 141 and the second output port 151 and corresponding thereto.

In the first embodiment of the invention, a characteristic resistance between the first ground layer 140 and the first common ground portion 161 is tuned by decreasing the line width of the first common ground portion 161. As well, an operation bandwidth of the balun 100 can be increased by tuning the characteristic resistance between the first ground layer 140, the second ground layer 150 and the first common ground portion 161.

A width of the feed portion 121 is smaller than a width of the extended feed portion 122 to bring that the a resistance between the feed portion 121 and the first ground layer 140 is greater than a resistance between the extended feed portion 122 and the second ground layer 150.

In this embodiment, the resistance between the feed portion 121 and the first ground layer 140 is 50Ω. The line width of the first and the second output ports is 1 mm. The line width of the first and the second ground layers is 3 mm. The width of the first common ground portion is 0.2 mm, and the width of the second common ground portion is 1 mm. A gap between the first and second ground layer is 0.25 mm. The height (thickness) of the first ground layer, the second ground layer and the common ground portion is 1 mm. The width (line width) of the first ground layer and the width of the second ground layer on a minor axis direction have a ratio with the line width of the first common ground portion from 18:1 to 12:1 corresponding to 1 mm height from the first common ground portion to the first ground layer when the first and second substrates are made of FR4. Additionally, the width of the extended feed portion has a ratio with the line width of the first common ground portion between 18:1 to 12:1

The gap 101 extends along a third axis Z', an included angle θ is formed between the third axis Z' and the second axis Y, and the included angle θ is between +/−80°.

The first ground layer 140 and the second ground layer 150 are trapezoid-shaped, the first output port 141 is located on a corner of the first ground layer 140, and the second output port 151 is located on a corner of the second ground layer 150. The length L of the first ground layer 140 and the second ground layer 150 on a major axis is a quarter of a wavelength of the signal corresponding to the center frequency of the operation band.

The second substrate 130 further comprises a first via post 133 and the second via post 134, the first via post 133 passes through the second substrate 130 and electrically connects the first ground layer 140 to the first common ground portion 161, and the second via post 134 passes through the second substrate 130 and electrically connects the second ground layer 150 to the first common ground portion 161.

In the embodiment, the feed conductor, the first ground layer, the second ground layer and the common ground layer are disposed on the first substrate and the second substrate to achieve a planar balun. The balun of the embodiment can be easily manufactured by semiconductor processes, which decrease costs and manufacturing time. Additionally, an operation bandwidth of the balun can be easily increased by tuning the line width of the first common ground portion.

Figure 3:
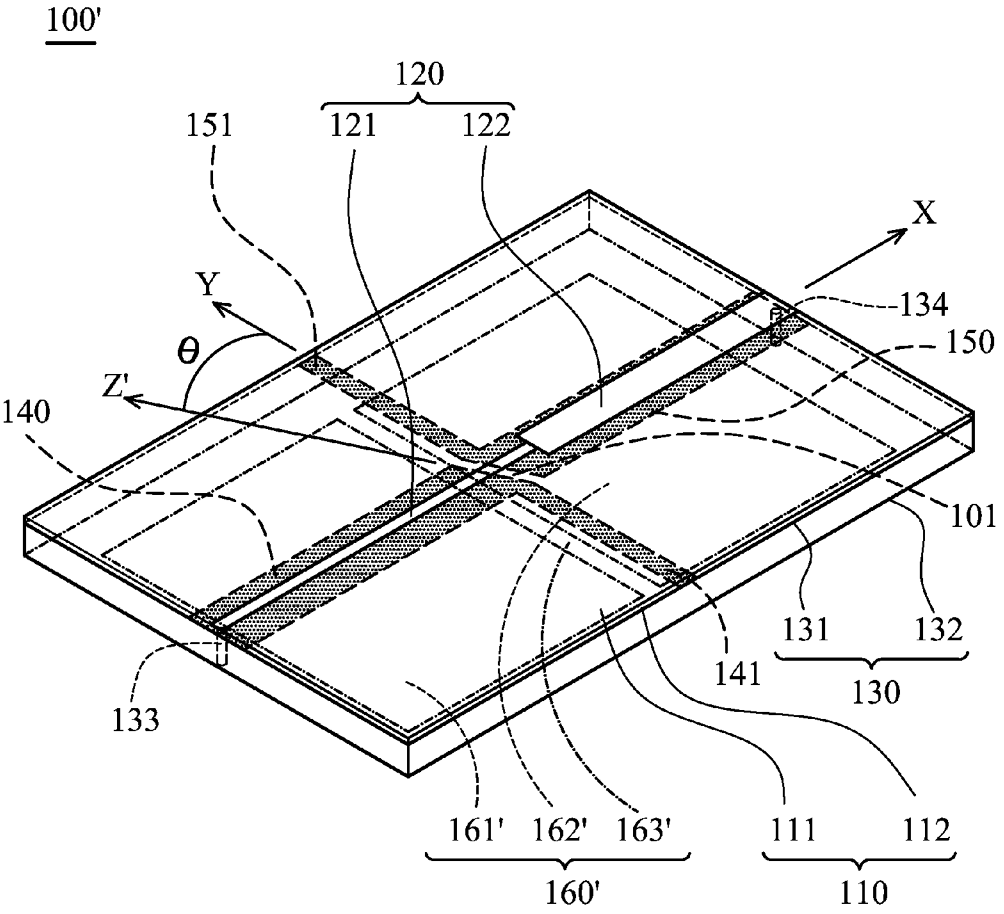
FIG. 3 shows a balun of a second embodiment of the invention.

FIG. 3 shows a balun 100' of a second embodiment of the invention for transforming an unbalanced signal to a balanced signal. The balun 100' comprises a first substrate 110, a feed conductor 120, a second substrate 130, a first ground layer 140, a second ground layer 150 and a common ground element 160'. The first substrate 110 comprises a first surface 111 and a second surface 112. The first surface 111 is opposite to the second surface 112. The feed conductor 120 comprises a feed portion 121 and an extended feed portion 122, wherein the feed conductor 120 is disposed on the first surface 111 extending along a first axis X. The second substrate 130 comprises a third surface 131 and a fourth surface 132, wherein the third surface 131 is opposite to the fourth surface 132, and the third surface 131 faces the second surface 112. The first ground layer 140 is disposed on the third surface 131, and corresponding to the feed portion 121. The second ground layer 150 is disposed on the third surface 131, and corresponding to the extended feed portion 122. A gap 101 is formed between the first ground layer 140 and the second ground layer 150. The common ground element 160' is disposed on the fourth surface 132, wherein the common ground element 160' comprises a first empty portion 161', a second empty portion 162' and a separation portion 163'. The separation portion 163' is located between the first empty portion 161' and the second empty portion 162'. The first empty portion 161' corresponds to the first ground layer 140, and the second empty portion 162' corresponds to the second ground layer 150. The common ground element 160' is electrically connected to the first ground layer 140 and the second ground layer 150.

In the second embodiment, a characteristic resistance between the first ground layer 140 and the common ground element 160' is tuned by the first empty portion 161'. As well, a characteristic resistance between the second ground layer 150 and the common ground element 160' is tuned by the second empty portion 162'. The operation bandwidth of the balun 100' is thus increased.

In the second embodiment, the first empty portion 161' and the second empty portion 162' are rectangular. However, the invention is not limited. The first empty portion 161' and the second empty portion 162' can also be a trapezoid, circular or other shape.

Figure 4:
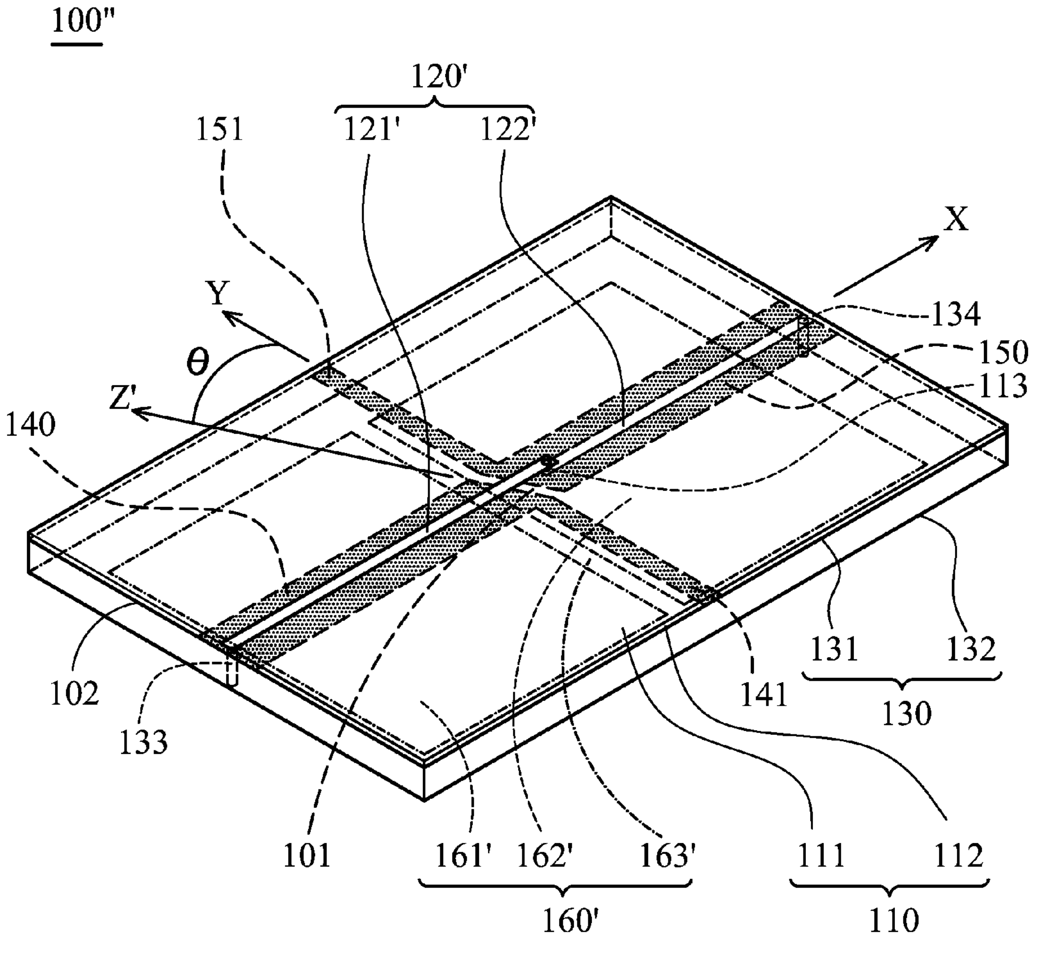
FIG. 4 shows a balun of a third embodiment of the invention.

FIG. 4 shows a balun 100" of a third embodiment of the invention for transforming an unbalanced signal to a balanced signal. The balun 100" comprises a first substrate 110, a feed conductor 120', a second substrate 130, a first ground layer 140, a second ground layer 150 and a common ground element 160'. The first substrate 110 comprises a first surface 111, a second surface 112 and a via post 113. The first surface 111 is opposite to the second surface 112.

The feed conductor 120' comprises a feed portion 121' and an extended feed portion 122'. The feed portion 121' is disposed on the first surface 111, and the extended feed portion 122' is disposed on the second surface 112. The feed portion 121' and the extended feed portion 122' are parallel to a first axis X. The feed portion 121' is electrically connected to the extended feed portion 122' through the via post 113. The first ground layer 140 is disposed on the third surface 131, and corresponding to the feed portion 121. The second ground layer 150 is disposed on the third surface 131, and corresponding to the extended feed portion 122. A gap 101 is formed between the first ground layer 140 and the second ground layer 150. The common ground element 160' is disposed on the fourth surface 132, wherein the common ground element 160' comprises a first empty portion 161', a second empty portion 162' and a separation portion 163'. The separation portion 163' is located between the first empty portion 161' and the second empty portion 162'. The first empty portion 161' corresponds to the first ground layer 140, and the second empty portion 162' corresponds to the second ground layer 150. The common ground element 160' is electrically connected to the first ground layer 140 and the second ground layer 150.

In the third embodiment, a separation material 102 is disposed between the first substrate 110 and the second substrate 130 to electrically separate the extended feed portion 122' from the second ground layer 150. The separation material 102 can be adhesive.

In the third embodiment, the distance between the extended feed portion 122' and the second ground layer 150 is reduced by moving the extended feed portion 122' from the first surface 111 to the second surface 112. The width of the extended feed portion 122' is thus decreased to form a proper characteristic resistance. In this embodiment, a width of the feed portion 121' is substantially equal to that of the extended feed portion 122'.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A balun, comprising:

a first substrate, comprising a first surface and a second surface, wherein the first surface is opposite to the second surface;

a feed conductor, comprising a feed portion and an extended feed portion, wherein the feed conductor is disposed on the first surface extending along a first axis;

a second substrate, comprising a third surface and a fourth surface, wherein the third surface faces the second surface;

a first ground layer, disposed on the third surface corresponding to the feed portion;

a second ground layer, disposed on the third surface corresponding to the extended feed portion, wherein a gap is formed between the first ground layer and the second ground layer; and a common ground element, disposed on the fourth surface, wherein the common ground element is electrically connected to the first ground layer and the second ground layer, the common ground element comprises a first common ground portion, and the first common ground portion is parallel to the first axis and corresponding to the feed conductor, wherein the first ground layer comprises a first output port, the second ground layer comprises a second output port, the first output port and the second output port are located on a second axis and extend toward opposite directions, and the second axis is perpendicular to the first axis.

2. The balun as claimed in claim 1, wherein a width of the first ground layer and a width of the second ground layer on a minor axis direction are greater than a line width of the first common ground portion.

3. The balun as claimed in claim 2, wherein the width of the first ground layer and the width of the second ground layer on the minor axis direction have a ratio with the line width of the first common ground portion between 18:1 to 12:1.

4. The balun as claimed in claim 2, wherein, the width of the extended feed portion has a ratio with the line width of the first common ground portion between 18:1 to 12:1.

5. The balun as claimed in claim 1, wherein a width of the feed portion is smaller than a width of the extended feed portion.

6. The balun as claimed in claim 1, wherein the common ground element further comprises a second common ground portion, and the second common ground portion is perpendicular to the first common ground portion, and parallel and corresponding to the first output port and the second output port.

7. The balun as claimed in claim 1, wherein the gap extends along a third axis, an included angle is formed between the third axis and the second axis, and the included angle is between +/−80°.

8. The balun as claimed in claim 1, wherein the first ground layer and the second ground layer are trapezoid-shaped, the first output port is located on a corner of the first ground layer, and the second output port is located on a corner of the second ground layer.

9. The balun as claimed in claim 1, wherein the second substrate further comprises a first via post and the second via post, the first via post passes through the second substrate and electrically connects the first ground layer to the first common ground portion, and the second via post passes through the second substrate and electrically connects the second ground layer to the first common ground portion.

10. A balun, comprising:

a first substrate, comprising a first surface and a second surface, wherein the first surface is opposite to the second surface;

a feed conductor, comprising a feed portion and an extended feed portion, wherein the feed conductor is disposed on the first surface extending along a first axis;

a second substrate, comprising a third surface and a fourth surface, wherein the third surface faces the second surface;

a first ground layer, disposed on the third surface corresponding to the feed portion;

a second ground layer, disposed on the third surface corresponding to the extended feed portion, wherein a gap is formed between the first ground layer and the second ground layer; and a common ground element, disposed on the fourth surface, wherein the common ground element is electrically connected to the first ground layer and the second ground layer, the common ground element comprises a first empty portion and a second empty portion, the first empty portion corresponds to the first ground layer, and the second empty portion corresponds to the second ground layer, wherein the first ground layer comprises a first output port, the second ground layer comprises a second output port, the first output port and the second output port are located on a second axis and extend toward opposite directions, and the second axis is perpendicular to the first axis, wherein the first ground layer and the second ground layer are trapezoid-shaped, the first output port is located on a corner of the first ground layer, and the second output port is located on a corner of the second ground layer.

11. The balun as claimed in claim 10, wherein the first empty portion and the second empty portion are rectangular.

12. The balun as claimed in claim 10, wherein a width of the feed portion is smaller than a width of the extended feed portion.

13. The balun as claimed in claim 10, wherein the common ground element further comprises a separation portion, the separation portion is located between the first empty portion and the second empty portion, and the separation portion is parallel and corresponding to the first output portion and the second output portion.

14. The balun as claimed in claim 10, wherein the gap extends along a third axis, an included angle is formed between the third axis and the second axis, and the included angle is between +/−80°.

15. The balun as claimed in claim 10, wherein the second substrate further comprises a first via post and the second via post, the first via post passes through the second substrate and electrically connects the first ground layer to the first common ground portion, and the second via post passes through the second substrate and electrically connects the second ground layer to the first common ground portion.

16. A balun, comprising:

a first substrate, comprising a first surface, a second surface and a via post, wherein the first surface is opposite to the second surface;

a feed conductor, comprising a feed portion and an extended feed portion, wherein the feed conductor is disposed on the first surface, the extended feed portion is disposed on the second surface, the feed portion and the extended feed portion are extending parallel to a first axis, and the feed portion is electrically connected to the extended feed portion by the via post;

a second substrate, comprising a third surface and a fourth surface, wherein the third surface is opposite to the fourth surface, and the third surface faces the second surface;

a first ground layer, disposed on the third surface corresponding to the feed portion;

a second ground layer, disposed on the third surface corresponding to the extended feed portion, wherein a gap is formed between the first ground layer and the second ground layer;

a separation material, disposed between the extend feed portion and the second ground layer; and a common ground element, disposed on the fourth surface, wherein the common ground element is electrically connected to the first ground layer and the second ground layer, and parallel to the first axis, wherein the first ground layer comprises a first output port, the second ground layer comprises a second output port, the first output port and the second output port are located on a second axis and extend toward opposite directions, and the second axis is perpendicular to the first axis, wherein the gap extends along a third axis, an included angle is formed between the third axis and the second axis, and the included angle is between +/−80°.

17. The balun as claimed in claim 16, wherein a width of the feed portion is substantially equal to a width of the extended feed portion.

18. A balun, comprising:

a first substrate, comprising a first surface and a second surface, wherein the first surface is opposite to the second surface;

a feed conductor, comprising a feed portion and an extended feed portion, wherein the feed conductor is disposed on the first surface extending along a first axis;

a second substrate, comprising a third surface and a fourth surface, wherein the third surface faces the second surface;

a first ground layer, disposed on the third surface corresponding to the feed portion, wherein the feed conductor is not shorted to the first ground layer;

a second ground layer, disposed on the third surface corresponding to the extended feed portion, wherein a gap is formed between the first ground layer and the second ground layer; and a common ground element, disposed on the fourth surface, wherein the common ground element is electrically connected to the first ground layer and the second ground layer, the common ground element comprises a first common ground portion, and the first common ground portion is parallel to the first axis and corresponding to the feed conductor.

* * * * *